United States Patent [19]
Smayling et al.

[11] Patent Number: 5,703,807
[45] Date of Patent: Dec. 30, 1997

[54] EEPROM WITH ENHANCED RELIABILITY BY SELECTABLE $V_{PP}$ FOR WRITE AND ERASE

[75] Inventors: Michael C. Smayling, Missouri City, Tex.; Giovanni Santin, Santa Rufina; Giulio Marotta, Contigliano, both of Italy

[73] Assignee: Texas Instruments Incorporated, Dallas, Tex.

[21] Appl. No.: 684,375

[22] Filed: Jul. 19, 1996

[51] Int. Cl.[6] .................. G11C 11/34; G11C 7/00
[52] U.S. Cl. .................. 365/185.03; 365/185.21; 365/185.29; 365/185.33; 365/218
[58] Field of Search .................. 365/185.03, 185.08, 365/185.17, 185.29, 185.33, 218, 226, 185.21

[56] References Cited

U.S. PATENT DOCUMENTS

| | | | |
|---|---|---|---|
| 4,628,487 | 12/1986 | Smayling | 365/185.29 |
| 4,855,954 | 8/1989 | Turner et al. | 365/185.17 |
| 5,006,974 | 4/1991 | Kazerounian et al. | 365/185.08 |
| 5,175,706 | 12/1992 | Edme | 365/226 |
| 5,282,170 | 1/1994 | Van Buskirk et al. | 365/185.33 |

Primary Examiner—David C. Nelms
Assistant Examiner—Trong Quang Phan
Attorney, Agent, or Firm—J. Dennis Moore; James C. Kesterson; Richard L. Donaldson

[57] ABSTRACT

A circuit and method for generating an erasure voltage and a programming voltage for an EEPROM array, the cells of the EEPROM array being capable of erasure and programming. A signal having an increasing voltage is generated. That signal is monitored, and the increase in voltage of said signal is terminated when the signal reaches a first selected maximum level in an erase operation of at least one cell of the EEPROM array. In a program operation of at least one cell of the EEPROM array, the increase in voltage of the signal is terminated when said signal reaches a second selected maximum level.

5 Claims, 2 Drawing Sheets

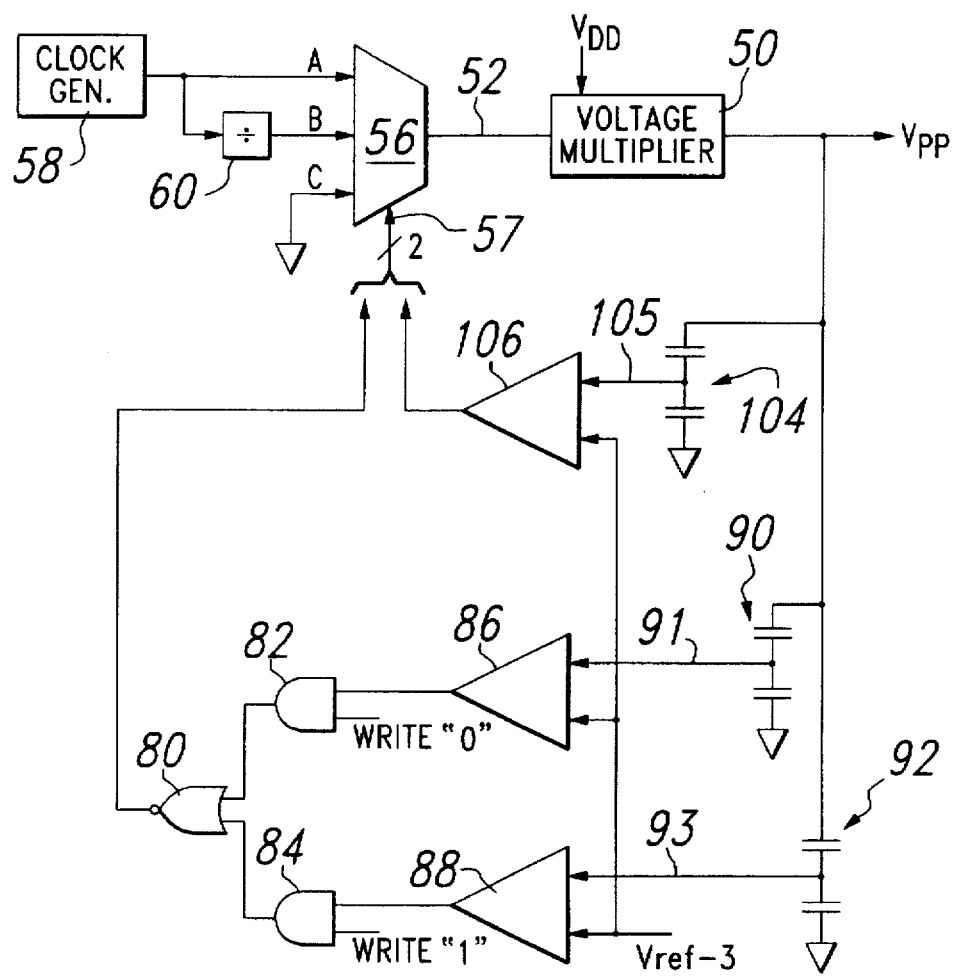
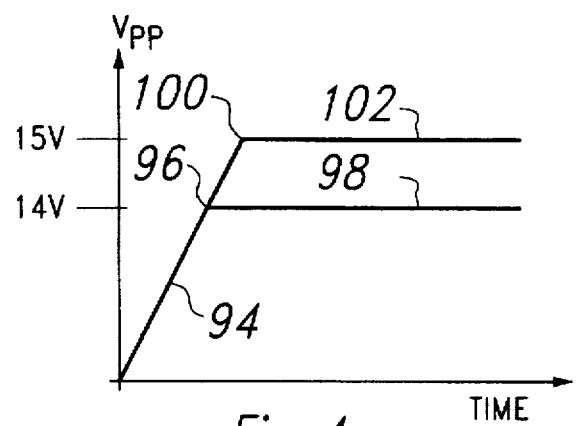
Fig. 4
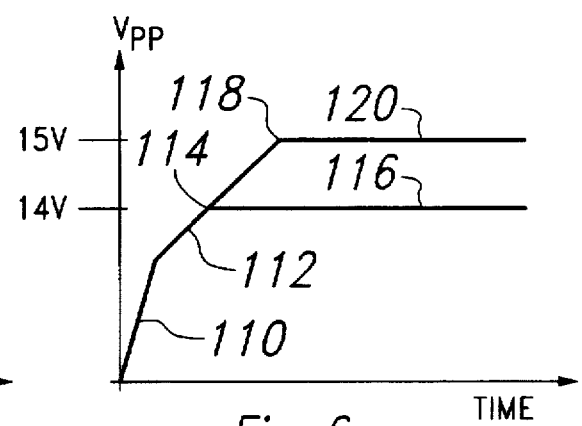
Fig. 6

5,703,807

EEPROM WITH ENHANCED RELIABILITY BY SELECTABLE $V_{PP}$ FOR WRITE AND ERASE

TECHNICAL FIELD OF THE INVENTION

This invention relates to Electrical Erasable Programmable Read Only Memories (EEPROMs), and more particularly relates to an improved EEPROM having a selectable $V_{PP}$ to improve reliability of the cells thereof.

BACKGROUND OF THE INVENTION

Presently, EEPROMs use the same maximum programming voltage $V_{PP}$(max) for both writing and erasing. An example of an EEPROM memory array in which a dual slope waveform is used for the programming voltage $V_{PP}$ is found in U.S. Pat. No. 4,628,487, entitled "Dual Slope, Feedback Controlled, EEPROM Programming," which issued to Michael C. Smayling on Dec. 9, 1986, and which is commonly assigned. In the invention disclosed in that prior art patent, the dual slope is used to rapidly apply a programming (or erasure) voltage across the thin oxide tunnelling diode portion of a cell, during the sharp ramp-up phase of the waveform, but then to abruptly change the ramp rate so as to maintain a constant E field across the thin oxide. When the waveform reaches its maximum level it is maintained at that level until the pulse is terminated.

A potential limitation of the prior art is that the application of the same $V_{PP}$(max) for both programming and erasing can lead to overprogramming of some cells to get sufficient erasing in the case of bit-selectable EEPROM arrays. This can overstress the thin oxide layer of such cells, which, in turn, can reduce the reliability of the array.

The present invention reduces the stress on the thin oxide layer of cells in an EEPROM array, and thereby improves the reliability of the cells, by providing an improved voltage regulator.

SUMMARY OF THE INVENTION

In accordance with the present invention, there is provided a circuit and method for generating an erasure voltage and a programming voltage for an EEPROM array, the cells of the EEPROM array being capable of erasure and programming. A signal having an increasing voltage is generated. That signal is monitored, and the increase in voltage of said signal is terminated when the signal reaches a first selected maximum level in an erase operation of at least one cell of the EEPROM array. In a program operation of at least one cell of the EEPROM array, the increase in voltage of the signal is terminated when said signal reaches a second selected maximum level.

These and other features of the invention will be apparent to those skilled in the art from the following detailed description of the invention, taken together with the accompanying drawings.

DESCRIPTION OF THE DRAWINGS

FIG. 4 is a graph of voltage versus time for an output of the circuit shown in FIG. 3;

FIG. 5 is a schematic diagram of a regulator circuit for controlling $V_{PP}$, incorporating features from the circuits of FIGS. 2 and 3; and FIG. 6 is a graph of voltage versus time for an output of the circuit shown in FIG. 5.

DETAILED DESCRIPTION OF THE INVENTION

Figure 1:
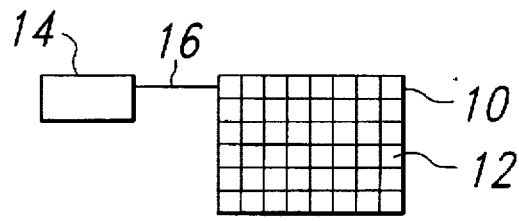
FIG. 1 is a block diagram of a prior art EEPROM array and regulator circuit, such as shown in U.S. Pat. No. 4,628,487.

FIG. 1 is a block diagram showing a prior art EEPROM memory array 10, such as one found in the aforementioned U.S. Pat. No. 4,628,487, including a number of individual cells 12, and showing a regulator circuit 14 providing a programming voltage $V_{PP}$ to the array 10 on line 16.

Figure 2:
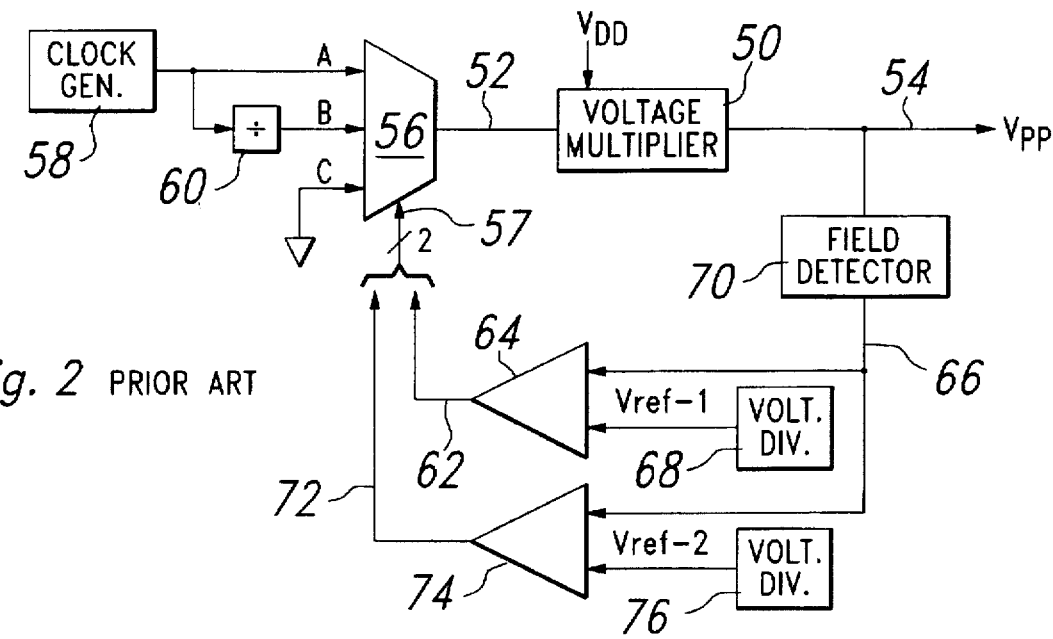
FIG. 2 is a schematic diagram of a prior art regulator circuit for controlling $V_{PP}$.

FIG. 2 is a schematic diagram of a prior art regulator circuit 14 for controlling the programming voltage, $V_{PP}$, for an EEPROM 12 (FIG. 1). The circuit employs a voltage multiplier 50, which may be, for example, a charge pump, and which has clock pulses applied to its input 52 and produces a voltage output on a line 54. The voltage multiplier 50 is a two-phase capacitor/diode network of standard construction. The voltage $V_{PP}$ output on line 54 is directly related to the number of pulses input to the multiplier 50 on line 52, and the slope is a function of pulse frequency. A multiplexer 56 selects three different inputs, A, B and C, controlled by the state of a two line control input 57 that receives signals from lines 62 and 72; the input A is from an on-chip clock generator 58 that is an oscillator of the type used as a substrate pump, while input B is from a divider 60 where the clock is divided down by, for example, 1:14 to change the slope of $V_{PP}$ from that produced by the application of the clock pulses on input A. The input C is grounded, i.e., zero frequency, which is used when the multiplier output has charged the $V_{PP}$ line 54 to its maximum level. The multiplexer 56 receives a first select input 62 from a differential detector 64 responsive to the detected field voltage on line 66 vs. the output of a first voltage divider 68 producing a reference voltage Vref-1. The detected field voltage on line 66 is produced in a field detector 70 which is a capacitive voltage divider. The other input 72 to the multiplexer 56 is from a second differential comparator 74, also responsive to the detected field voltage on line 66, vs. a second reference voltage Vref-2 from another divider 76.

The circuit shown in FIG. 2 operates to cause the output voltage $V_{PP}$ to be generated in three parts. When enabled, the outputs of differential detectors 64 and 74 are both low, i.e., the select input 57 of multiplexer 56 is "00", the multiplexer 56 first provides the output of clock generator 58 to the voltage multiplier 50, and $V_{PP}$ rapidly rises. When $V_{PP}$ reaches a "trip point" voltage $V_T$ selected to limit the electric field across the thin oxide of the tunnel diode portion of a memory transistor in EEPROM 12 array, the voltage on line 66 is the same as Vref-1 and the output 62 of differential detector 64 goes high, causing multiplexer 56 to send the divided frequency output of frequency divider 60 to voltage multiplier 50. This causes the output voltage $V_{PP}$ to slow its rate of rise. When $V_{PP}$ reaches the maximum desired level, $V_{PP}$(max), the voltage on line 66 is the same as Vref-2 and the output 72 of differential detector 74 goes high, causing multiplexer 56 to send the zero frequency (ground) signal to voltage multiplier 50. This causes the output voltage $V_{PP}$ to stop rising, and to remain essentially "flat" at that maximum desired level, $V_{PP}$(max).

As mentioned above, the regulator circuit 14 shown in FIG. 2, which is basically that disclosed in U.S. Pat. No.

4,628,487, while providing an advantageous dual-slope waveform $V_{PP}$, nonetheless provides that waveform to the same maximum $V_{PP}(max)$ for both writing and erasing of the cells with which such regulator is used, which can lead to overprogramming, or over-writing, to get sufficient erasing in the case of bit-selectable EEPROM arrays. This can overstress the thin oxide layer of the cells, which, in turn, can reduce the reliability of the array.

Figure 3:
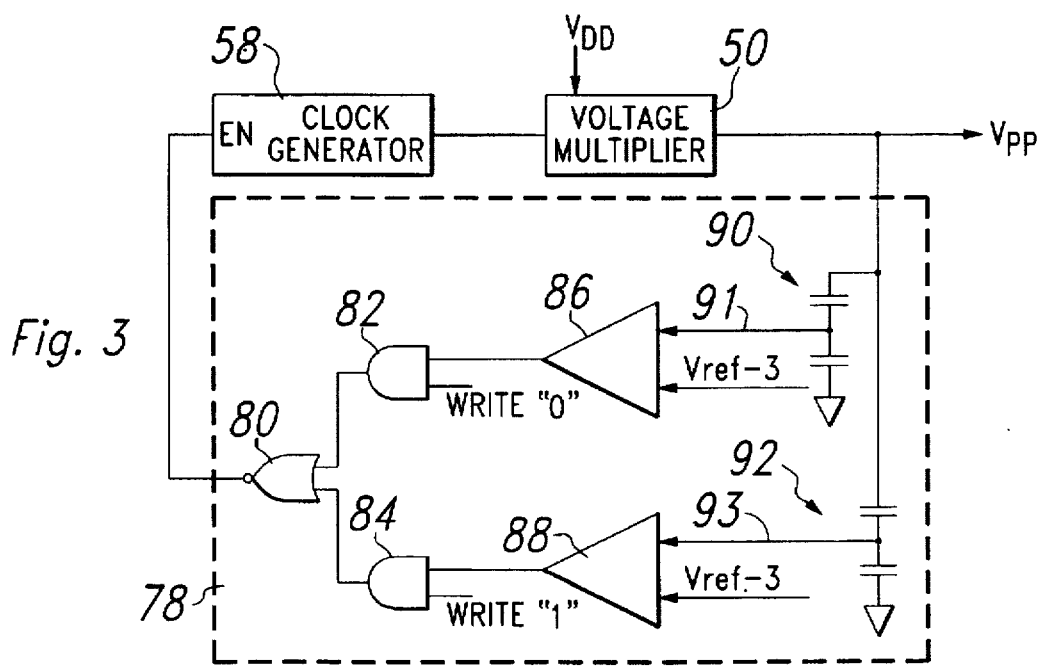
FIG. 3 is a schematic diagram of a regulator circuit for controlling $V_{PP}$, incorporating features according to the present invention.

FIG. 3 is a schematic diagram of a regulator circuit, to be substituted for regulator circuit 14 of FIG. 2, for controlling $V_{PP}$, incorporating features according to the present invention. A clock generator 58 and voltage multiplier 50 are provided, as in the prior art. However, unlike the prior art, there is provided a $V_{PP}$ selector circuit 78 constructed in accordance with the principles of the present invention. The $V_{PP}$ selector circuit 78 comprises a NOR gate 80, first AND gate 82, second AND gate 84, first comparator 86, second comparator 88, first capacitive voltage divider 90 and second capacitive voltage divider 92. One end of each of the first and second capacitive voltage dividers 90, 92, is connected to $V_{PP}$, as shown. The other end of each of the first and second capacitive voltage dividers 90, 92, is connected to ground, as shown. The output 91 of first capacitive voltage divider 90 is connected to a first input of first comparator 86, while the second input of first comparator 86 is connected to receive a reference voltage Vref-3, which is a stabilized voltage preferably at approximately the same level as the main power supply voltage for the memory array, $V_{DD}$.

The output of first comparator 86 is connected to a first input of AND gate 82, while the second input of AND gate 82 is connected to receive a WRITE "0" input. The output 93 of second capacitive voltage divider 92 is connected to a first input of second comparator 88, while the second input of second comparator 88 is connected to receive the reference voltage Vref-3. The output of second comparator 88 is connected to a first input of AND gate 84, while the second input of AND gate 84 is connected to receive a WRITE "1" input. The outputs of AND gates 82, 84, are the inputs to NOR gate 80, as shown. The output of NOR gate 80 is connected to an enable input En of clock generator 58.

The first and second capacitive voltage dividers 90, 92, are constructed in the same manner as the field detector 70 described above in connection with FIG. 2, with the capacitances thereof selected so as to produce a desired amount of voltage step down from $V_{PP}$, determined according to desired $V_{PP}(max)$ targets, better understood in connection with a description of the operation of the $V_{PP}$ selector circuit 78, which will now be provided.

The principles involved in operation of the $V_{PP}$ selector circuit 78 are as follows. To overcome the above-described deficiencies of the prior art, it is desired to generate a $V_{PP}$ that has a maximum level $V_{PP}(maxE)$ in an erase, or "WRITE 0", operation that is sufficient and appropriate to erase the cells, but which has a maximum level $V_{PP}(maxP)$ in a program, or "WRITE 1", operation that is sufficient and appropriate to program the cells, but which is less than $V_{PP}(maxE)$ so as to avoid overprogramming of the cells. In practice, it has been found in one application that a $V_{PP}$ (maxE) level of 15V and a $V_{PP}(maxP)$ level of 14V was optimal. Actual voltages for $V_{PP}(maxE)$ and $V_{PP}(maxP)$ in other EEPROM array applications may be different. However, once the principles disclosed herein are understood, those of ordinary skill in this art area can tailor these voltage levels to those appropriate for those applications so as to optimize the reliability of the arrays.

Accordingly, in the operation of the $V_{PP}$ selector circuit 78 first voltage divider 90 monitors, or tracks, $V_{PP}$, and provides a voltage, $V_{D1}$, divided, or scaled, from $V_{PP}$, which is provided on line 91, to an input of first comparator 86, where it is compared against Vref-3. The capacitors in voltage divider 90 are selected so that when $V_{PP}$ reaches $V_{PP}(maxE)$, 15V, then $V_{D1}$ is equal to Vref-3. Thus, the output of first comparator 86 changes from a "0" to a "1" when $V_{PP}$ reaches 15V. If the current operation is an erase, or WRITE "0", operation, then signal WRITE "0" will be at a "1" level, and the output of AND gate 82 will go to a "1" level. When the output of AND gate 82 goes to a "1" level the output of NOR gate 80 goes low, disabling clock generator 98 which, in turn, stops the increase in the level of $V_{PP}$, which therefore remains at 15V, the desired $V_{PP}$ (maxE) level.

A program, or "WRITE 1", operation is similar to a "WRITE 0" operation. Second voltage divider 92 tracks $V_{PP}$, providing a proportionately scaled voltage, $V_{D2}$, which is provided on line 93, to an input of second comparator 88, where it is compared against Vref-3. The capacitors in voltage divider 92 are selected so that when $V_{PP}$ reaches $V_{PP}(maxP)$, 14V, then $V_{D2}$ is equal to Vref-3. Thus, the output of second comparator 88 changes from a "0" to a "1" when $V_{PP}$ reaches 14V. Since the current operation is a program, or WRITE "1", operation, then signal WRITE "1" is at a "1" level, and the output of AND gate 84 goes to a "1" level. When the output of AND gate 84 goes to a "1" level the output of NOR gate 80 goes low, disabling clock generator 58 which, in turn, stops the increase in the level of $V_{PP}$, which therefore remains at 14V, the desired $V_{PP}$ (maxP) level.

FIG. 4 is a graph of the output $V_{PP}$ of the circuit shown in FIG. 3, versus time. The above described behavior of $V_{PP}$ under control of the circuit of FIG. 3 can be seen quite clearly. Thus, when either a WRITE "0" or a WRITE "1" signal goes active (FIG. 3), thereby enabling the clock generator 58, the output signal $V_{PP}$ begins to rise from zero, proceeding up the initial rising portion 94 of the curve (FIG. 4). If the activating signal is a WRITE "1" signal (FIG. 3), the clock generator 58 is stopped when $V_{PP}$ reaches 14 volts, depicted as point 96 on the curve (FIG. 4), and then $V_{PP}$ continues essentially flat, i.e., remaining at 14 volts, as shown by flat portion 98 of the curve. On the other hand, if the activating signal is a WRITE "0" signal (FIG. 3), the clock generator 58 is stopped when $V_{PP}$ reaches 15 volts, depicted as point 100 on the curve (FIG. 4), and then $V_{PP}$ continues essentially flat, i.e., remaining at 15 volts, as shown by flat portion 102 of the curve.

It will be appreciated that the $V_{PP}$ selector circuit 78 is readily adaptable to be used in any of a variety of circuits that provide $V_{PP}$ for EEPROM arrays. For example, it can be employed advantageously in conjunction with the regulator circuit shown in FIG. 1. FIG. 5 is a schematic diagram of a regulator circuit for controlling $V_{PP}$, incorporating the inventive features from the circuit of FIG. 3 into the circuit of FIG. 2.

As in the circuit of FIG. 2, in the circuit of FIG. 5 the output of clock generator 58 is provided to the A input of multiplexer 56 and to the input of frequency divider 60. The output of frequency divider 60 is provided to the B input of multiplexer 56. The C input of multiplexer 56 is grounded, i.e., connected to a zero frequency source. The output 52 of multiplexer 56 is connected to the input of voltage multiplier 50. Multiplexer 56 is controlled by the state of a two line input 57. The output of voltage multiplier 50 is $V_{PP}$.

As in the circuit of FIG. 3, in the circuit of FIG. 5 first comparator 86 has a first input connected to line 91 from first voltage divider 90 that divides down $V_{PP}$ to a first divided voltage, $V_{D1}$, which is provided on line 91, and has the other input connected to Vref-3. Second comparator 88 has a first input connected to line 93 from second voltage divider 92 that divides down $V_{PP}$ to a second divided voltage, $V_{D2}$, which is provided on line 93, and has the other input connected to Vref-3. The output of first comparator 86 is connected to one input of AND gate 82, the other input of AND gate 82 receiving a WRITE "0" signal. The output of second comparator 88 is connected to one input of AND gate 84, the other input of AND gate 84 receiving a WRITE "1" signal. The outputs of AND gate 82 and AND gate 84 are connected to the two inputs of NOR gate 80. The output of NOR gate 80 is connected to one line of input 57 to multiplexer 56.

Continuing now with a description of FIG. 5, a third voltage divider 104 is provided that divides down $V_{PP}$ to a third divided voltage, $V_{D3}$, which is provided on line 105, to a first input of third comparator 106. The second input of third comparator 106 is connected to Vref-3. The output of third comparator 106 is connected to the other line of input 57 to multiplexer 56.

The operation of first voltage divider 90, second voltage divider 92, first comparator 86, second comparator 88, AND gate 82, AND gate 84 and NOR gate 80 is the same as in FIG. 3 to generate an output signal of NOR gate 80 under the same conditions. Thus, when the WRITE "0" signal is active the output of NOR gate 80 goes active when $V_{PP}$ reaches $V_{PP}(maxE)$, 15 volts. On the other hand, when the WRITE "1" signal is active the output of NOR gate 80 goes active when $V_{PP}$ reaches $V_{PP}(maxP)$, 14 volts.

Third voltage divider 104 monitors, or tracks, $V_{PP}$, and provides a voltage, $V_{D3}$, divided, or scaled, from $V_{PP}$ to an input of third comparator 106, where it is compared against Vref-3. The capacitors in voltage divider 104 are selected so that when $V_{PP}$ reaches the "trip point" voltage $V_T$, then $V_{D1}$ is equal to Vref-3. Thus, the output of first comparator 86 changes from a "0" to a "1" when $V_{PP}$ reaches $V_T$.

In operation, when $V_{PP}$ is to be generated, the outputs of NOR gate 80 and third comparator 106 are inactive, select input 57 is "00" and multiplexer 56 is selected to provide the output of clock generator 58 directly to voltage multiplier 50. Thus, $V_{PP}$ rises rapidly. However, when $V_{PP}$ reaches the "trip point" voltage $V_T$, then the output of third comparator 106 goes active and multiplexer 56 is selected to provide the output of frequency divider 60 to voltage multiplier 50. Thus, $V_{PP}$ rises less rapidly. If the operation is a WRITE "0" operation, i.e., an erase, then when $V_{PP}$ reaches $V_{PP}(maxE)$ NOR gate 80 goes active and multiplexer 56 is selected to provide the zero frequency (ground) signal to voltage multiplier 50, and then $V_{PP}$ remains flat at $V_{PP}(maxE)$. On the other hand, if the operation is a WRITE "1" operation, i.e., a program operation, then when $V_{PP}$ reaches $V_{PP}(maxP)$ NOR gate 80 goes active and multiplexer 56 is selected to provide the zero frequency (ground) signal to voltage multiplier 50, and then $V_{PP}$ remains flat at $V_{PP}(maxP)$.

The operation of the circuit of FIG. 5 in controlling the output voltage $V_{PP}$ can be seen clearly in FIG. 6, which is a graph of the output $V_{PP}$ of the circuit shown in FIG. 5, versus time. The above described behavior of $V_{PP}$ under control of the circuit of FIG. 5 can be seen quite clearly. Thus, when either a WRITE "0" or a WRITE "1" operation is begun, the clock generator 58 is provided to voltage multiplier 50 (FIG. 5), and the output signal $V_{PP}$ begins to rise from zero, proceeding up the initial rising portion 110 of the curve (FIG. 6). When $V_{PP}$ reaches the "trip point" voltage $V_T$, then the rate of increase in $V_{PP}$ abruptly decreases, shown by point 112, and the output signal $V_{PP}$ continues to rise, at this slower rate, proceeding up the second rising portion 113 of the curve. If the activating signal is a WRITE "1" signal (FIG. 5), the clock generator 58 is stopped when $V_{PP}$ reaches 14 volts, depicted as point 114 on the curve (FIG. 6), and then $V_{PP}$ continues essentially flat, i.e., remaining at 14 volts, as shown by flat portion 116 of the curve. On the other hand, if the activating signal is a WRITE "0" signal (FIG. 5), the clock generator 58 is stopped when $V_{PP}$ reaches 15 volts, depicted as point 118 on the curve (FIG. 6), and then $V_{PP}$ continues essentially flat, i.e., remaining at 15 volts, as shown by flat portion 120 of the curve.

Thus, the circuit of FIG. 5 provides the benefits of both the circuit of FIG. 2 and the circuit of FIG. 3.

Other changes, substitutions and alterations can be made herein without departing from the spirit and scope of the invention as defined by the appended claims.

What is claimed is:

1. A voltage regulator for generating an erasure voltage and a programming voltage for an EEPROM array having a plurality of cells, the cells of the EEPROM array being capable of erasure and programming, comprising:

generating means for generating a signal having an increasing voltage; and means, coupled to said generating means, for monitoring said signal and for terminating the increase in voltage of said signal when said signal reaches a first selected maximum level in an erase operation of at least one cell of said EEPROM array, and for terminating the increase in voltage of said signal when said signal reaches a second selected maximum level in a program operation of at least one cell of said EEPROM array.

2. A method for generating an erasure voltage and a programming voltage for an EEPROM array having a plurality of cells, the cells of the EEPROM array being capable of erasure and programming, comprising the steps of:

generating a signal having an increasing voltage;

monitoring said signal and terminating the increase in voltage of said signal when said signal reaches a first selected maximum level in an erase operation of at least one cell of said EEPROM array; and monitoring said signal and terminating the increase in voltage of said signal when said signal reaches a second selected maximum level in a program operation of at least one cell of said EEPROM array.

3. A voltage regulator for generating an erasure voltage and a programming voltage for an EEPROM array having a plurality of cells, the cells of the EEPROM array being capable of erasure and programming, comprising:

a voltage generator that generates a voltage $V_{PP}$ having a waveform characteristic of increasing level over time, and being provided to the EEPROM array for erasure and programming of the cells thereof;

first means, coupled to said voltage generator, for monitoring $V_{PP}$ during an erasure operation of at least one cell in the EEPROM array and for terminating the increase in level of $V_{PP}$ when $V_{PP}$ reaches a first predetermined voltage level selected for a desired erasure characteristic of said EEPROM array; and second means, coupled to said voltage generator, for monitoring $V_{PP}$ during a programming operation of at least one cell in the EEPROM array and for terminating the increase in level of $V_{PP}$ when $V_{PP}$ reaches a second predetermined voltage level selected for a desired programming characteristic of said EEPROM array.

4. A voltage generator for generating an erasure voltage and a programming voltage for an EEPROM array having a plurality of cells, the EEPROM array being capable of erasure and programming, comprising:

a clock generator capable of generating a clock signal;

a voltage multiplier coupled to said clock generator that provides a voltage $V_{PP}$ that increases in level in response to said clock signal, and being provided to the EEPROM array for erasure and programming of the cells thereof;

first means coupled to said voltage multiplier for monitoring $V_{PP}$ and for disabling said clock generator when $V_{PP}$ reaches a first predetermined voltage level selected for a desired erasure characteristic of said EEPROM array; and second means coupled to said voltage multiplier for monitoring $V_{PP}$ and for disabling said clock generator when $V_{PP}$ reaches a second predetermined voltage level selected for a desired programming characteristic of said EEPROM array.

5. A voltage generator for generating an erasure voltage and a programming voltage for an EEPROM array having a plurality of cells, the EEPROM array being provided with a first, supply voltage $V_{DD}$ that is less than the required levels for erasure and programming of the cells of the array, comprising:

a clock generator capable of generating a clock signal;

a voltage multiplier, coupled to said clock generator, responsive to $V_{DD}$, that provides a second, output voltage $V_{PP}$ that increases in level in response to said clock signal;

first means, coupled to said voltage multiplier, for monitoring $V_{PP}$ and for providing a third voltage scaled by a first amount with respect to $V_{PP}$;

a first comparator, coupled to said first means, for comparing said third voltage to a fourth, reference voltage and for providing an output signal when said third voltage exceeds said fourth voltage;

second means, coupled to said voltage multiplier, for monitoring $V_{PP}$ and for providing a fifth voltage scaled by a second amount with respect to $V_{PP}$;

a second comparator, coupled to said second means, for comparing said fifth voltage to said fourth voltage and for providing an output signal when said fifth voltage exceeds said fourth voltage; and means, coupled to said clock generator, to said first comparator and to said second comparator, for disabling said clock generator in response to said output signal from said first comparator, during an erase operation of said EEPROM array, and in response to said output signal from said second comparator, during a programming operation of said EEPROM array.

* * * * *